United States Patent [19]

Murphy et al.

[11] 4,337,516
[45] Jun. 29, 1982

[54] SENSOR FAULT DETECTION BY ACTIVITY MONITORING

[75] Inventors: Richard D. Murphy; Douglas H. Clelford, both of Trumbull, Conn.

[73] Assignee: United Technologies Corporation, Hartford, Conn.

[21] Appl. No.: 163,445

[22] Filed: Jun. 26, 1980

[51] Int. Cl.³ .................. G06G 7/78; G06F 15/20
[52] U.S. Cl. .................. 364/551; 364/432; 364/571
[58] Field of Search ............ 364/551, 434, 571, 433, 364/432, 431

[56] References Cited

U.S. PATENT DOCUMENTS

| | | | |
|---|---|---|---|
| 3,584,507 | 6/1971 | Hohenberg | 364/551 X |
| 3,593,012 | 7/1971 | Lang | 364/551 |
| 3,678,256 | 7/1972 | Harenberg | 364/551 X |
| 3,750,465 | 8/1973 | Howell et al. | 364/551 X |
| 3,867,717 | 2/1975 | Moehring et al. | 364/551 X |
| 3,872,292 | 3/1975 | Dawson, Jr. | 364/551 X |
| 4,176,396 | 11/1979 | Howatt | 364/551 |

Primary Examiner—Edward J. Wise
Attorney, Agent, or Firm—M. P. Williams

[57] ABSTRACT

Faults in a sensor (10) are detected by excess rate fault determination by taking the differentiated (58, 107), rate limited (60, 100, 111) integral (64, 112) from the raw sensor output (72, 113) and indicating a fault (15, 117) in the event that the difference exceeds a predetermined magnitude (76, 114). A null fault (22, 91) is provided in the event that the sensor output does not show a significant change (52, 88) within a given time interval (20, 80) whenever a related sensor (31) indicates (29, 84) that the first sensor (10) should have measurable activity. Both analog (FIG. 1) and digital (FIG. 2, FIG. 3) embodiments are disclosed.

2 Claims, 3 Drawing Figures

SENSOR FAULT DETECTION BY ACTIVITY MONITORING

The Government has rights in this invention pursuant to Contract No. N00019-75-C-0267 awarded by the Department of the Navy.

TECHNICAL FIELD

This invention relates to detecting faults in sensors, such as gyros, and more particularly to sensor fault detection which does not require use of redundant sensors.

BACKGROUND ART

Many control systems operate in response to sensors of various types. As an example, a helicopter automatic flight control system responds to attitude and heading gyros as well as altimeters, and to attitude rate gyros and accelerometers in order to control the maneuvering of the aircraft. The control of the aircraft, when an automatic flight control system is in use, is therefore dependent upon the signals provided to the flight control system by the various sensors (gyros, rate gyros and accelerometers, etc.). In the event of failure of a sensor, an undesirable disturbance in the aircraft flight could result. In some cases, the disturbance may be abrupt or tumultuous, and in other cases the disturbance may be gradual. For instance, if a heading gyro failed at a given setting while the aircraft were on heading hold, the effect would not be noticed until a substantial perturbation (such as a wind gust) was observed to throw the aircraft off heading, or until the pilot desired to change heading; otherwise the only observable result would be a slow drift of the aircraft off its desired heading. On the other hand, if the heading gyro failed by provision of a maximum output signal, the aircraft would begin to maneuver immediately in an opposite direction as the automatic flight control tried to correct the apparent heading error.

Any sensor failure in an aircraft automatic flight control system requires pilot response to react to the change in aircraft maneuvering as well as to monitor any error-indicating alarms for disengagement of the faulty system. In many cases, the mere disengagement of the faulty system can cause a reverse maneuvering effect (as a hard error in one direction is immediately converted to a zero error, or the like). Similarly, if the pilot reacts to the disturbance by introducing a countermanding input through the pilot controls, disengagement of the faulty system will leave a undesirable pilot command uncompensated, causing a further disturbance.

At times, such as hovering a few feet above the ocean, such failures in an aircraft control system can be disastrous. For instance, failure of a radar altimeter in such a case could cause the aircraft to actually contact the water surface.

In order to overcome difficulties with such sensors, it has been known to use a pair of sensors of an identical type (redundant sensors) the outputs of which are compared, a failure or fault being indicated in the event that the outputs of the two sensors fail to track within a tolerance limit of each other. However, this not only requires additional sensors but additional signal processing channels for each of the sensors. Furthermore, there are conditions in which two sensors of the same type are likely to fail at the same time, thereby providing the same erroneous output signal so that they are within the prescribed tolerance of each other and therefore the comparison is not indicative of failure of either of them. Such a case can exit if the Pitot-static tube protection covers are not removed from both Pitot-static tubes of an aircraft before the beginning of a flight: both airspeed sensors would be indicating the same (zero) airspeed, and no fault would be indicated.

In an attempt to reduce the hardware required by redundant comparison, and to overcome some of the shortcomings of redundant comparisons, attempts have been made in the past to utilize a form of sensor activity monitoring. This activity monitoring known to the art has taken the derivative of a sensor's output and examined it to see if it had some amount of change on it. In the event that the rate of change of the sensor output with respect to time becomes excessive in view of the permissible aircraft maneuver in the axis which the sensor detects, a fault can be indicated. However, any spurious noise in the sensor output is amplified by virtue of differentiation of the sensor output signal, which leads to nuisance fault indications (indications of excessive rate when there really is none) due to noise. For this reason, the tolerance or sensitivity of such a fault detector has to be significantly reduced, even to the point where bonafide faults of a lesser magnitude are not even detectable. Furthermore, since many sensors are operable in normal, permissible maneuvers (such as level flight at a constant heading and speed on a calm day), such detectors cannot be monitored to sense the lack of a minimum amount of activity as an indication of fault, since zero is permissible over relatively long periods of time.

DISCLOSURE OF INVENTION

Objects of the invention include detecting the usual failure modes of sensors, sensor fault detection without use of redundant sensors, and detection of sensor failures which result in too small a change in their outputs.

According to the present invention, the proper operation of sensors is determined by monitoring the rate of change in the sensor output, both for excessive rates of change as well as for inadequate rates of change at times when it is otherwise determined that the sensor output should be changing. According further to the invention, a sensor raw output is compared with a rate limited sensor output, and if the two are not within a tolerance limit of each other, an excess fault rate is indicated. In still further accord with the invention, the activity of a related sensor is used as an indication that the monitored sensor should have a changing output, and if the output of the monitored sensor does not have at least a minimal rate of change, a null fault is indicated.

The invention is disclosed in both analog and digital embodiments, the digital embodiment having been completely implemented and being preferred.

The invention may be readily implemented in either analog or digital systems, utilizing apparatus and techniques which are well within the skill of the art in the light of the teachings which follow herein.

Other objects, features and advantages of the present invention will become more apparent in the light of the following detailed description of exemplary embodiments thereof, as illustrated in the accompanying drawings.

BEST MODE FOR CARRYING OUT THE INVENTION

Figure 1:
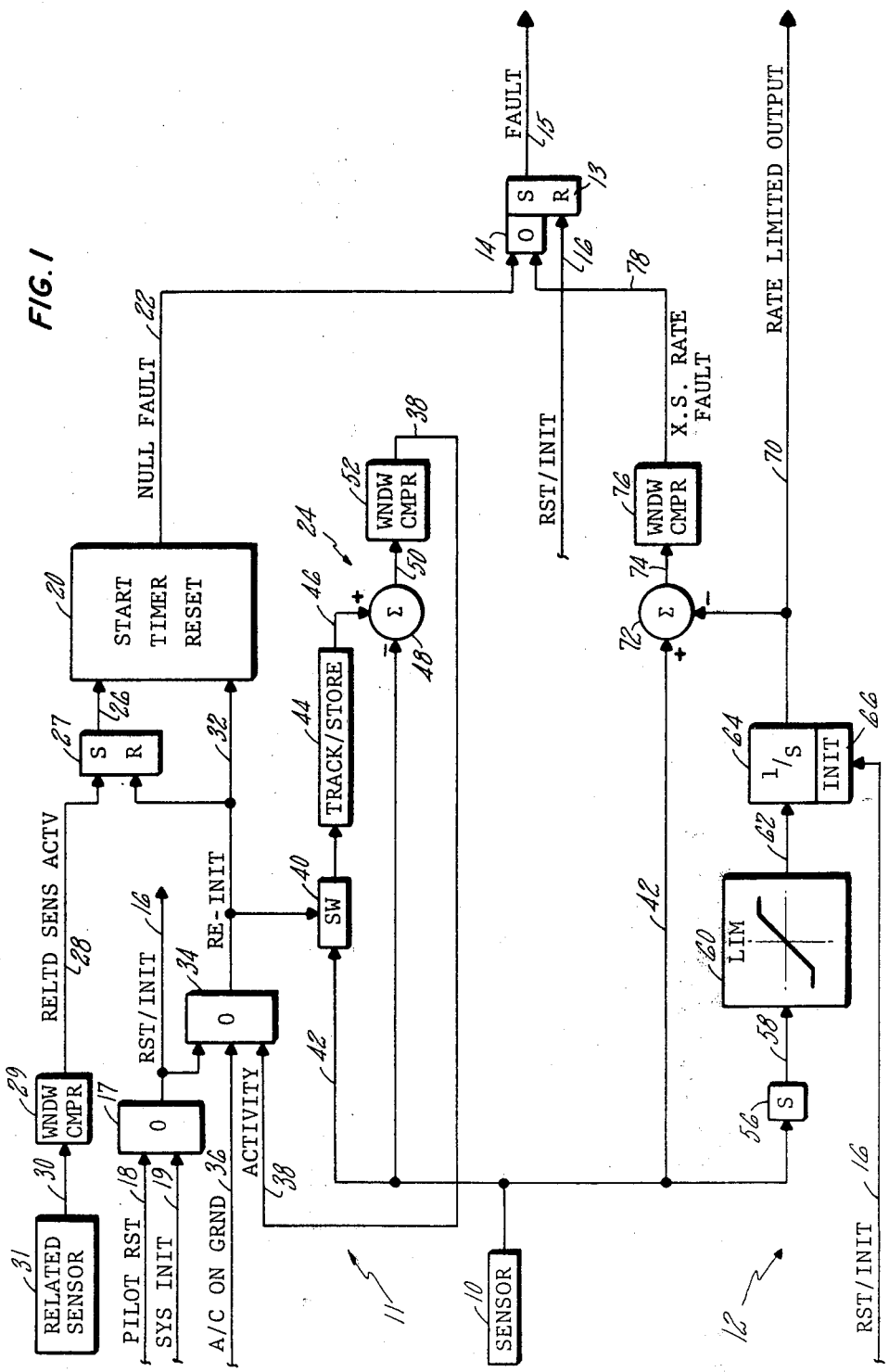
FIG. 1 is a simplified schematic block diagram of an analog embodiment of the present invention.

Referring now to FIG. 1, a sensor 10 has its activity monitored for fault detection by a null fault portion 11 (in the upper half of FIG. 1) and by an excess rate fault portion 12 (in the lower half of FIG. 1), either of which can set a fault indicating bistable device 13 in response to an OR circuit 14. The output of the bistable device 13 comprises a fault signal on a line 15.

The operation of the activity monitoring system of FIG. 1 can be reset or reinitialized by a signal on a line 16 generated by an OR circuit 17 in response either to a manually activated pilot reset signal on a line 18 or an automatic flight control system initiation signal on a line 19, which would typically appear when an automatic flight control system is first turned on. The use of the reset/initialize signal on the line 16 is described hereinafter.

The null fault detecting portion 11 consists mainly of a timer 20 which will generate a null fault signal on a line 22 if it is allowed to time out before it is reset by a sensor activity detector 24, as described more fully hereinafter. However, the timer 20 is allowed to start only in response to a signal 26 from a bistable device 27 which is set by a related sensor activity signal on a line 28 from a window comparator 29 which is connected by a line 30 to a related sensor 31. By "related sensor" it is meant that the sensor bears some relationship to the parameter being sensed by the sensor 10 which the circuitry herein is monitoring. For instance, the sensor 10 may be an aircraft heading gyro, and the related sensor 31 may be a yaw rate gyro; the sensor 10 may be an airspeed sensor, and the related sensor 31 may be the pitch rate gyro of a helicopter; the sensor 10 may be an altimeter, in which case the related sensor 31 may be either a vertical accelerometer or a rate of climb indicator; or the sensor 10 may comprise either a pitch or roll attitude gyro and the related sensor 31 may correspondingly be either a pitch or roll rate gyro, respectively. Similarly, in applications other than control of helicopters or other aircraft, other combinations of sensors may utilize the activity monitoring of the present invention. An example could be that the sensor 10 may comprise a furnace fuel flow indicator. It should be noted that the particular sensor and related sensor are not significant to the invention except to the extent that the various limits and details appropriate to such sensors should be employed, in accordance with the skill of the art in the light of the teachings herein.

When the related sensor 31 is providing an output signal on a line 30 which the window comparator 29 determines to be in excess of some minimum magnitude in either a positive or negative sense, as determined by the positive and negative reference voltages utilized within the window comparator 29, the signal on the line 28 will set the bistable device 27 so that the signal on the line 26 will enable the timer to start timing. Unless the timer 20 is reset prior to time-out of the timer, the timer will provide a time-out signal, designated as a null fault signal herein, on the line 22, which will cause the OR circuit 14 to set the bistable 13 and provide the fault signal on the line 15. The bistable 13 is initially placed in the reset state by the reset/initialize signal on the line 16. The timer 20 is reset by a reinitialize signal on a line 32 which is generated by an OR circuit 34 in response to the reset/initialize signal on the line 16, or to a signal on a line 36 indicating that the aircraft is on the ground, or in response to an activity signal on a line 38 which is generated by the activity detector 24. The reinitialize signal on the line 32 is utilized to open a switch 40 (such as to block a field effect transistor from conduction) that is used to connect the sensor output signal on a line 42 to a track/store circuit 44. Thereafter, the track/store circuit 44 will continue to provide on its output line 46 a signal indicative of the magnitude of the sensor output signal on the line 42 at the moment that the reinitialize signal appeared on the line 32. The signal on the line 46 is compared with the instantaneous sensor output signal on the line 42 by means of a summing junction 48 which provides a signal indicative of the difference between those two signals over a line 50 to a window comparator 52. The window comparator 52 compares the difference indicated by the signal on the line 50 with plus and minus reference signals to determine whether the difference exceeds some preestablished threshold magnitude; if it does, the window comparator 52 provides the activity signal on the line 38 which passes through the OR circuit 34 and generates the reinitialize signal on the line 32 to reset the timer. Therefore, if the instantaneous output of the sensor differs by some predetermined threshold magnitude, from the output it had when the timer was next previously reset, before the timer is allowed to time-out, there will be no null fault signal on the line 22. But if the window comparator 52 fails to detect a threshold magnitude of change in the sensor output after the timer is reset and before the timer times out, then there will be a null fault signal generated on the line 22.

A significant aspect of this part of the invention is that the sensor 10 can be tested for some minimal amount of activity, even though it may, in normal operation, have no significant output over long periods of time, because of the fact that the activity of the related sensor 31 is monitored to determine when the sensor 10 should have some measurable output. Thus utilization of a related, through not redundant sensor to determine when a particular sensor should have activity worth monitoring enables activity monitoring of a sensor for determination that it may have failed in a null, or no output condition (such as loss of a power supply to a gyro).

The output signal of the sensor 10 on the line 42 is also monitored for changing at an excessive rate, such as may occur in any hard-over type of failures. For instance, if the sensor 10 consisted of a position measuring potentiometer which is connected between divergent potentials and had a wiper that is positioned in response to the element being monitored, the loss of one of those potentials would cause the wiper to assume essentially the other potential in a rapid fashion. This would have the same effect as if the wiper were instantaneously moved from its current position to one of the extreme positions of the potentiometer. However, the excess rate fault detector portion of this invention will also test rates which are simply in excess of those that are permitted, even if such excessive rates are not as a consequence of a hard-over type of failure.

The sensor output signal on the line 42 is applied to a differentiator 56 (denoted by the Laplacian operator "s") to provide a signal on a line 58 which is a function of the rate of change of the sensor output signal on the line 42. The signal is applied to a limiter 60, which may simply comprise an amplifier having both positive and negative clamps on its output, to provide a rate limited signal on a line 62 which is applied to an integrator 64. The integrator 64 is capable of having an initial value set therein in response to the signal on the line 62 by means of the reset/initialize signal on the line 16 being applied to an initialization switch 66 within the integrator 64. As an example, if the integrator 64 comprises a high gain amplifier having capacitive feedback, it may be initialized by having also a resistive feedback, with electronic switching (such as a pair of complementary transistors) to cause the feedback resistor to be connected to the input when the reset/initialize signal is present on the line 16, or, alternatively, to cause the capacitive feedback to be applied to the input when the reset/initialize signal is not present on the line 16. Thus, whenever operation is reestablished by means of the reset/initialize signal on the line 16, the integrator 64 is caused to have its initial output value established at the value of the signal on the line 62. But when the reset/initialize signal disappears, the integrator begins to integrate as determined by the magnitude and polarity of the signal on the line 62. The output of the integrator 64 on a line 70 comprises a rate limited manifestation of the instantaneous sensor output signal on the line 42. Because the signal is first differentiated in the differentiator 56, and then integrated by the integrator 64, it is fully restored except to the extent that the rate of change of the signal exceeded the limits established by the limiter 60. Thus if the signal on the line 70 is different from the signal on the line 42, it will be because the signal on the line 42 is changing at a rate which exceeds the predetermined rate established by the limiter 60 for the particular function involved. For instance, if the sensor 10 comprises an aircraft heading gyro, the heading of the aircraft could change at a rate on the order of 90° per second. If it changes faster than some predetermined permissible rate such as that, the signal on the line 58 would be of such a magnitude that it would be limited by the limiter 60, and therefore the output of the integrator 64 would instantaneously differ from the magnitude of the signal on the line 42. This difference is detected by a summing junction 72 which provides a signal indicative of the difference on a line 74 to a window comparator 76 that compares the magnitude of this signal against positive and negative reference voltages indicative of a predetermined threshold difference which is determined to be indicative of an excessive rate fault. If the rate of change of sensor output signal on the line 42 is too fast, the signal on the line 74 will indicate a difference which causes the window comparator to provide an excess fault rate signal on a line 78, which passes through the OR circuit 14 to set the bistable 13 and generate the fault signal on the line 15.

If desired, the rate limited output on the line 70 may preferably be used as an output from the sensor 10 for controlling an automatic flight control system function. This provides the additional advantage that if the sensor 10 does experience a hard-over failure so that there is an abrupt change in the magnitude of signal on the line 42, the signal on the line 70 will not be as abrupt, but will change only at the rate determined by the magnitude of limit in the limiter 60. Therefore, during the period of time that it takes to sense and react to the hard-over error, the function being controlled by the sensor will not be disrupted nearly as much when the rate limited output on the line 70 is utilized to control that function. This is equivalent to the use of signals which are slew rate limited in some cases to ensure that they will not exceed permissible values.

The manner of implementing the circuitry described in FIG. 1 may vary considerably utilizing various techniques and apparatus which are known to the art. For instance, the function of the timer 20 may be implemented by means of an integrator which responds to a constant input voltage when the voltage input is connected thereto, said voltage being connected only in response to closing of a switch when the related sensor activity signal is present on the line 28. The time-out of the timer in such a case is determined by the fact that the integrator output is a ramp voltage which increases linearly with time. If the integrator had a one volt per second output value for a one volt input, a ten volt signal could be subtracted therefrom and the result tested to see if it were negative, simply by passing it through a unilateral amplifier. If it were negative, that would that the timer had timed out. The comparisons performed by the window comparators 29, 52, 76 could instead be performed by taking the absolute value of the signal to be tested, subtracting a reference value from it, and passing the result through a circuit to determine the polarity of the result. The absolute value circuit can simply comprise a pair of complementary amplifiers, each having a unilateral output, so that one amplifier or the other will provide an output of a singular polarity in dependence upon the polarity of the input. The limiter 60 may simply comprise an amplifier having its output clamped in both the negative and positive directions. The integrator 56 may simply take the form of an RC integrating network, or it may take the form of any well known active differentiation feedback circuit.

The foregoing is a description of an exemplary analog embodiment of the invention. The functions performed in the circuitry of FIG. 1 may, instead, be performed by apparatus including a digital computer. A suitable computer is the type disclosed in our commonly owned, copending U.S. patent application Ser. No. 928,583, filed on Aug. 31, 1978 and entitled SELECTIVE DISABLEMENT IN FAIL-OPERATIONAL, FAIL-SAFE MULTI-COMPUTER CONTROL SYSTEM, now U.S. Pat. No. 4,270,168. In said copending application, two identical computers work together and each has the capability of sensing when there is disagreement between them, and if the other computer does not admit fault, one computer can disable both of them. The computers include the capability of comparing redundant sensors, and if they disagree, providing a third input signal derived from a different sensor for determining which sensor has failed. However, that action is limited to only certain sensors (the pitch rate and roll rate gyros being compared with pitch and roll rates derived from the vertical gyro). However, the present invention may be utilized in that apparatus, particularly with sensors for which an alternative is not readily derived mathematically.

Figure 2:
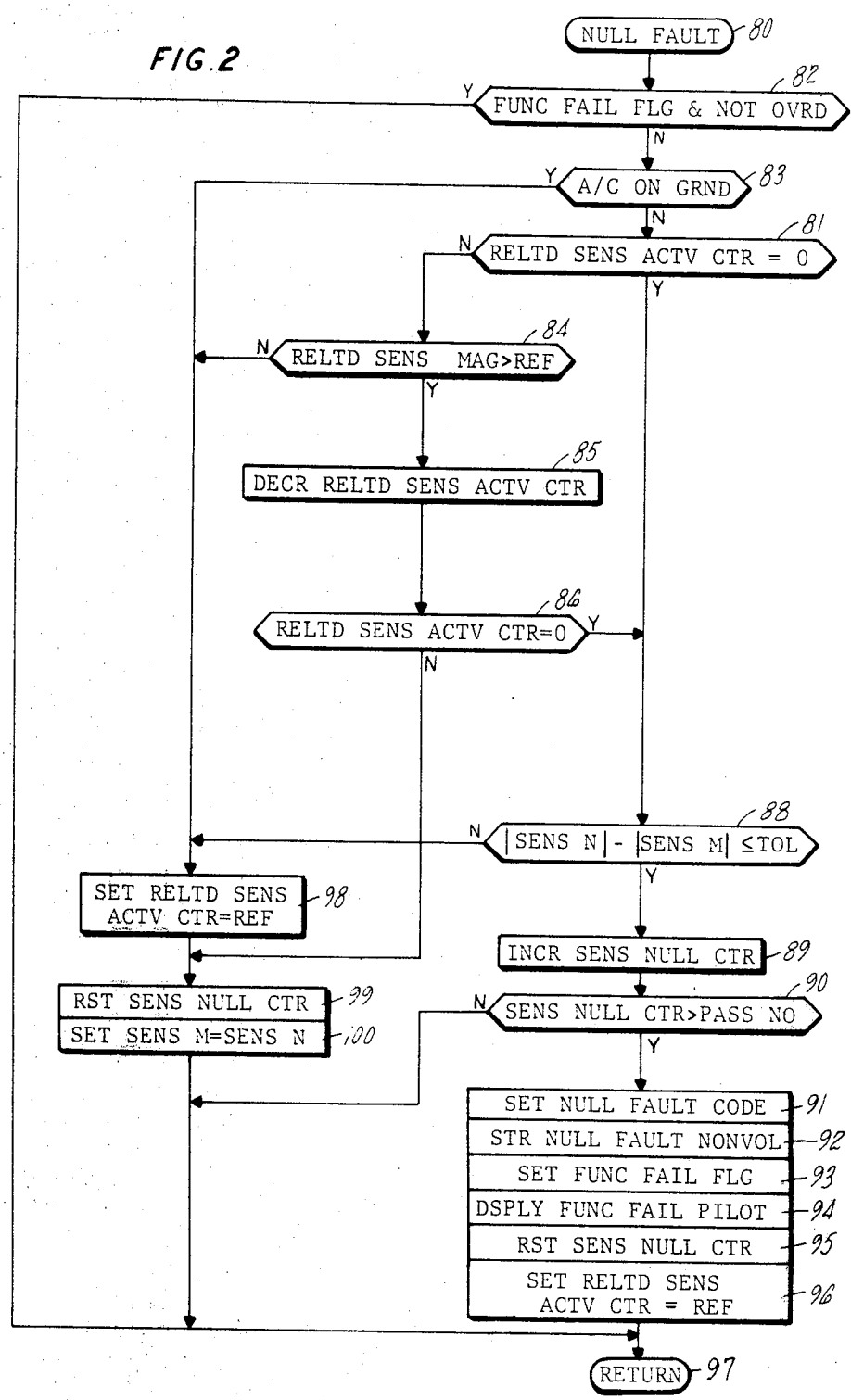
FIG. 2 is a simplified logic flow diagram of an exemplary digital embodiment of the null fault detection portion of the invention.

Referring now to FIG. 2, a simplified exemplary logic flow diagram performs the null fault detection portion similar to the portion 11 in FIG. 1. The routine is reached through a null fault entry point 80 and a first test 82 tests a functional failure flag as well as a pilot override signal (which are described more fully hereinafter) to determine whether the particular function controlled by the sensor being activity monitored has previously been determined to have a failure (either as a consequence of this sensor or another sensor related to the function) and whether or not the pilot has decided to override it to see if the function can be reestablished. This simple avoids performing the routine if the routine is unnecessary due to shutdown of the particular function which the sensor relates to. If the function has not failed or the pilot is overriding the failure of the function, a negative result of test 82 will lead to a test 83 which determines if the aircraft is on the ground. This is similar to the aircraft on ground signal on the line 36 of FIG. 1. If the aircraft is on the ground, then the activity monitoring is to be reset or reinitiated in a manner described hereinafter. But if the aircraft is not on the ground, a negative result from test 83 will lead to a test 81 which determines if the related sensor activity test has previously been satisfied. If satisfied, then test 88 (described hereinafter) will be performed. If not, the negative result of test 81 will lead to a test 84 in which the magnitude of output signal of a related sensor is compared against a reference, in the same fashion that the window comparator 29 in FIG. 1 determines whether the related sensor 31 has an output signal on a line 30 greater than some predetermined threshold. If the related sensor is providing an output of a sufficient magnitude, an affirmative result of test 84 will lead to a step 85 in which a related sensor activity counter is decremented from some preestablished reference. This is a "pass counter" of a usual type. For instance, if this counter is initially set to five, each time test 84 is affirmative the counter is decremented until it reaches zero. Then, in a test 86 the counter is tested to see if it does equal zero; if it does, then the activity monitoring of the sensor in question (such as sensor 10 in FIG. 1) for null faults will be undertaken. But if not, then the remainder of the null sensing is bypassed for the time being. This ensures that the related sensor has indicated some activity through five cycles of operation (or whatever number of cycles are used as the reference). This provides some assurance that the sensor under test (such as sensor 10) should be having some activity and therefore can be tested for a null fault. Thus, an affirmative result of test 86 will enable the sensor test in subsequent passes through step 81 (counter =0).

When the tests and steps 81-86 indicate that activity of the sensor 10 can be monitored, a test 88 determines whether the current value of sensor output (SENS N) is within a prescribed tolerance of the preceding value of sensor output (SENS M). If it is, an affirmative result of test 88 will cause step 89 to increment a sensor null counter. This is also a pass counter of the usual type which ensures that a fault has been sensed several cycles in a row before the fault is recognized. This alleviates nuisance fault indications as a result of spurious conditions which quickly go away. Then, the setting of the null counter is tested in step 90 to determine if it has advanced to a count higher than a preestablished pass number (such as on the order of three or five cycles). If the null has been detected several times in a row, so that the setting of the sensor null counter exceeds the predetermined pass number, an affirmative result of test 90 will lead to steps 91-94 in which: a null fault code is set; the null fault code is stored in a nonvolatile portion of memory (if a system of the type disclosed in said copending application is utilized); the fact that the related function has failed is registered by setting a function fail flag; and the fact of function failure is displayed to the pilot. By function failure it is meant, for instance the heading hold function of the automatic flight control system which is utilized when the aircraft is on automatic pilot. This function is lost if the heading gyro is determined to have a null fault. The pilot is interested in whether or not he has the function, rather than in what particular component failed. However, maintenance personnel are interested in what particular component failed, and thus the null fault code for the particular sensor is set and stored in nonvolatile memory to ensure that this factor will be known to maintenance personnel when the aircraft returns for repairs. The function failure flag, set in step 93, is the flag which is tested in test 82, as described hereinbefore. The function failure flag relating to a particular sensor may in fact have been set as a result of a fault in a related or other portion of the system. Thus, heading hold could be lost because of failure of a power supply used in the heading hold portion of the automatic flight control system. That would also set the same functional failure flag as that which can be set in step 93 and tested in test 82.

In step 95 the sensor null counter (incremented in step 89 and tested in test 90) is reset so that following this failure it will have to count through the entire pass-number of cycles before the fault will be indicated, and in step 96 the related sensor activity counter is reset to its reference value so that it will begin decrementing from the full reference value (such as five cycles) after operation is reestablished following the present fault. Thereafter, this routine will cause return to other portions of a computer program through a return point 97.

At periods of time when there is no activity in the related attitude of the aircraft (or other related function in non-aircraft implementations of the invention), such as when the aircraft is on the ground as indicated in test 83 or when a related sensor is providing an insignificant output signal as determined in test 84, the related sensor activity counter is set to the reference in a step 98. Thus even if there has been some activity from the related sensor, so that the counter may have counted once or twice, in any cycle in which the activity falls below the requisite magnitude before the reference numbers of cycles pass, the activity counter will be reset to the reference value so that counting will have to start anew thereafter. And, in such case, the remaining portion of the program from step 85 through step 96 of the routine of FIG. 2 is bypassed. But the sensor null counter is reset in a step 99 and the sensor output value is updated in a step 100.

In cases where the related activity counter indicates that the related sensor (31, FIG. 1) has had significant activity over a required number of cycles so that the sensor (10, FIG. 1) may be activity monitored to test for a null fault, if the test 88 is a negative (eg, sensor is sufficiently active), because of the fact that the new value of the sensor output is different from the old value of the sensor output by more than the prescribed tolerance, then the remainder of the null fault program (steps 89-96) is bypassed, the related sensor activity counter is reset to the reference value in step 98, the sensor null counter is reset in step 99, and the sensor output value is updated in step 100, as described hereinbefore. In any case, however, where a null is detected in step 88 because the new value of sensor output is within tolerance of the old value of sensor output, the sensor null counter is incremented in step 89 and is tested in step 90. During the first couple of failures, test 90 will be negative because several nulls have to be sensed in a row before they will be recognized as a fault as described hereinbefore. In such case, no update takes place and the routine is exited at return point 97.

Comparing the null fault detection in a digital fashion as set forth in FIG. 2 with the analog hardware shown in FIG. 1, test 83 is equivalent to the resetting activity of the aircraft on ground signal on the line 36 (FIG. 1). Test 84 is equivalent to the window comparator 29 (FIG. 1). Test 88 is equivalent to window comparator 52 (FIG. 1) and step 89 and test 90 are equivalent to the time-out of the timer 20 (FIG. 1). The reinitialization signal on line 32 of FIG. 1 finds its counterpart in steps 98 and 99 (as well as steps 95 and 96) of FIG. 2.

Figure 3:
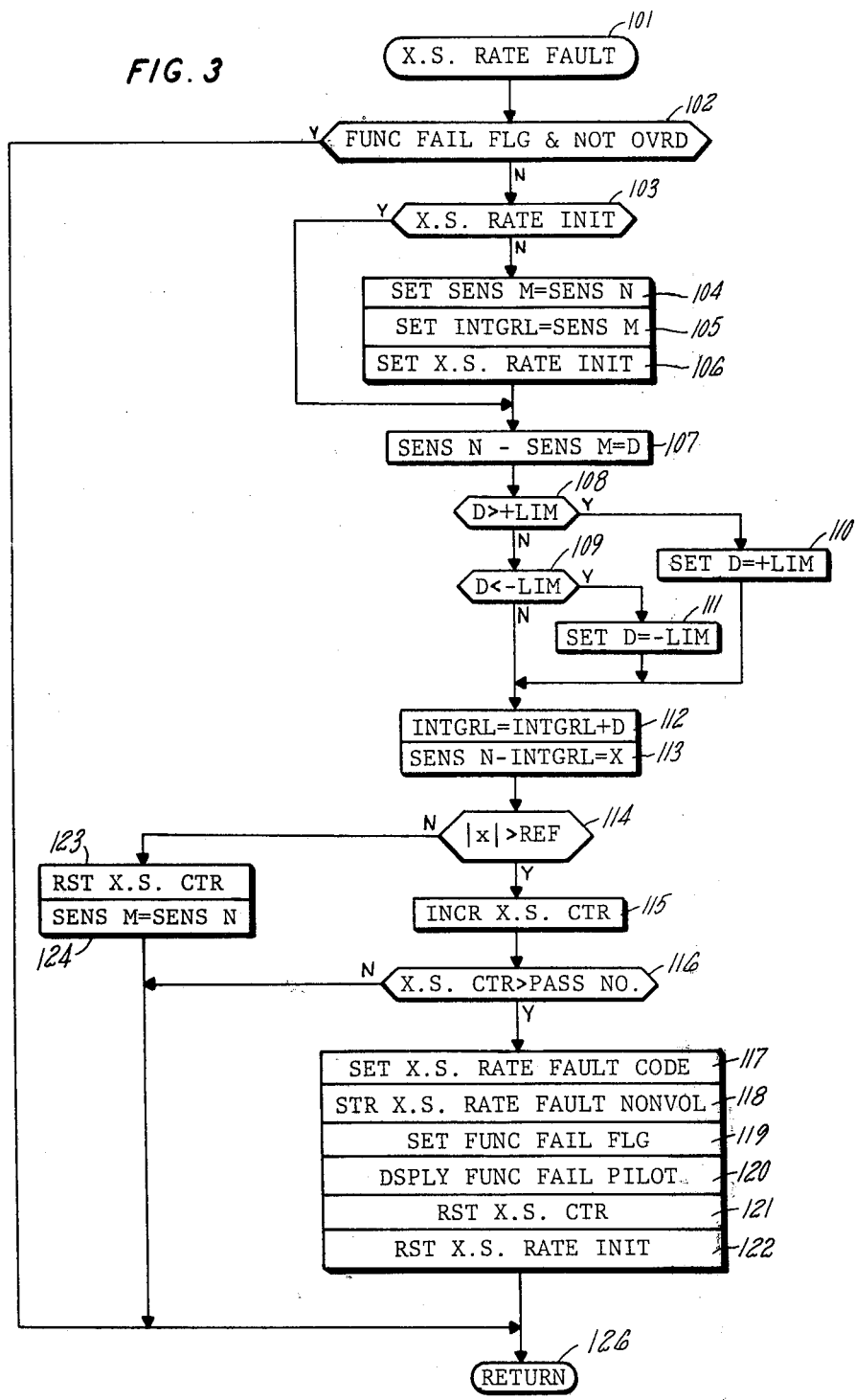
FIG. 3 is a simplified logic flow diagram of an exemplary digital embodiment of the excess rate fault portion of the invention.

Referring now to FIG. 3, the excess rate fault portion of the invention may be performed in a digital manner by a subroutine which is reached through an excess rate fault entry point 101. The first test 102 simply determines whether or not the routine should be performed, in the same fashion as the test 82 in FIG. 2. If test 102 is negative, a test 103 determines whether initialization of the integration function has been performed or should be performed. This is equivalent to the application of the reset/initialize signal on the line 16 to initialize the setting of the integrator 64 in FIG. 1. If initialization has not previously taken place, then a step 104 will update the value of the last cycle sensor output to the current value of the sensor output, step 105 will establish an initial value in the integrator (some register or memory location bearing a number which is integrated as described hereinafter) to the current value of the sensor output, and a step 106 will set the excess rate initialization flag indicating that initialization has taken place, which flag will be interrogated in the subsequent pass through the routine by test 103 to cause bypassing of steps 104-106.

In FIG. 3, a step 107 takes the difference between the current value of the sensor output and the previous value of the sensor output to find the difference or differential therebetween. Step 107 is equivalent to the differentiator 56 in FIG. 1. Then a pair of tests 108, 109 determine if this difference is within limits, and if it is not, it is set to an appropriate positive or negative limit by corresponding steps 110, 111, which are equivalent to the limiter 60 in FIG. 1. In step 112 integration is performed by adding to the integral value established upon initialization in step 105, the difference or differential D which is found in step 107. If the difference D was less than either of the limits so that both tests 108 and 109 were negative, and this value were not clamped to either the positive limit or the negative limit, the value D added to the integral value should equal the current value of the sensor output. If it does not, the difference therebetween (C) found in step 113 will be greater than some reference value (which is preestablished in dependence upon the particular function involved) as determined in a test 114. That is to say if the difference in the present and the current value exceeds some limit, that means that the sensor output is changing at too high a rate. Since the rate is too high, the difference (D) will be limited, so that it being added to the integral will not equal the current value. However, it may not exceed a reference difference utilized in test 114 sufficiently to indicate a fault. But on subsequent passes, since the integral has already fallen behind, if this high rate continues, the integral will fall further behind as inadequate amounts of D are added thereto. So, eventually, the difference in the current sensor value from the integral value will cause an affirmative result of test 114. When this happens, an excess counter is incremented in a step 115 (this is the same form of pass counter to require several faults in a row before they are recognized), and the excess counter is tested in a test 116 to see if it exceeds the preselected pass number. If it does, then the fault is recognized and housekeeping operations are performed in steps 117-122. In step 117, the excess rate fault code for the particular sensor being monitored is set, and this code may be stored in nonvolatile memory by step 118 (in a system of the type disclosed in the aforementioned copending application). In step 119, the function failure flag is set (this is the same function failure flag that is settable in step 93 in FIG. 2). And, the fact that the function has failed may be displayed to the pilot by step 120 (corresponding to step 94 in FIG. 2). Then the excess counter is reset in step 121 and the excess rate initialization flag is reset in step 122, so that, on subsequent passes through this routine (after the function failure flag is no longer set or in the event that the pilot does press an override switch so that test 102 is negative), the routine is reinitiated, in the same fashion that the reset/initialize signal on the line 16 reinitiates the excess rate fault detection in FIG. 1.

In the event that test 114 determines that the difference between the current value and the integrated value does not exceed the reference, a negative result of test 114 will cause the excess counter to be reset in a step 123 and the last cycle value of the sensor output is updated in a step 124. But notice, once failures have been detected, so that the pass counter is being incremented several times, the last cycle value of the sensor output is not updated because step 124 is bypassed. This is necessary when high rates of change are being detected because, if the sensor failed in a hard-over condition and this hard-over condition were updated to the old value, then, in all subsequent cycles, the new value and the old value of the output would be essentially equal so the pass counter would not be incremented. In other words, the fault can only be monitored for several cycles if the old value is retained so that several cycles of a hard-over new value will be compared against it and provide the necessary excess over the reference in test 114. Either step 124 (in the absence of any failure), test 116 (after at least one fault has been sensed), or step 122 (after a pass number of faults have been sensed) will lead to other parts of the program through a return point 126.

As described hereinbefore, the digital embodiment of the invention described with respect to FIGS. 2 and 3 may be practiced in apparatus of the type disclosed in the aforementioned copending application. For instance, the invention may be practiced by reading-in sensor values by means of direct memory access data moves as explained in the tables therein; and the specific subroutines disclosed herein may be performed in one of the interrupt routines RT 1-RT 4. For instance, an airspeed fault detection test can be performed in subroutine 906 (FIG. 9 therein), or a heading fault detection test can be performed in subroutine 1304 (FIG. 13 therein).

In any utilization of the invention where a rate limited signal (such as the signal on the line 70 in FIG. 1) is already provided as a safety measure, the apparatus 56, 60 and 66 need not be employed, but such already-rate-limited signal may be applied directly to the summing junction 72 and may be utilized as a source of the data identified in FIG. 3 as the integrator value summed with the difference or differential in step 112, such signal being applied directly for subtraction in step 113.

The invention has been disclosed and described as it applies in automatic flight control systems of a helicopter or other aircraft. However, the principles herein are applicable to other systems in cases where the inactivity or hyperactivity of a sensor may be monitored in accordance with the invention to detect faults in the sensor, and particularly where there is a related sensor that allows identifying periods when nulls should not be present, thereby permitting null fault detection as well as excess rate fault detection in accordance herewith. Naturally, the analog or digital embodiments will be chosen in dependence upon whether the digital processing capability is otherwise to be available in any system in which the invention is to be utilized. The type of digital system which is available is irrelevant, since the functions to be performed in implementing the invention are simple and straightforward, and are generally capable of performance by even the smallest of microcomputers. Therefore, the functions of the digital embodiment, as described with respect to FIGS. 2 and 3 hereinbefore, are implementable utilizing ordinary programming techniques suitable for virtually any type of digital processing system. The disclosed embodiments employ signal magnitude-responsive techniques, but the invention may be employed where a given parameter is characterized in a signal by frequency, pulse width or other variables.

Similarly, although the invention has been shown and described with respect to exemplary embodiments thereof, it should be understood by those skilled in the art that the foregoing and various other changes, omissions and additions in the form and detail thereof may be made therein and thereto, without departing from the spirit and the scope of the invention.

We claim:

1. An activity-monitored sensor system comprising:
   a first sensor providing a first output signal indicative of a given physical parameter; and
   a second sensor providing a second output signal indicative of a second parameter related to said given physical parameter so that said second output signal is also indicative of whether said first output signal should or should not be changing as a function of time;
   characterized by:
   signal processing means connected for response to the output signals of said first and second sensors, for providing signals indicative of first, second and third predetermined threshold signal magnitudes, responsive to said second output signal for providing a first excess signal indicative of said second parameter being in excess of a first one of said predetermined threshold signal magnitudes for providing a second excess signal indicative of a change in the magnitude of said first output signal in excess of a second one of said predetermined threshold signal magnitudes, for providing a signal indicative of null fault in response to presence of said first excess signal concurrently with absence of said second excess signal for a predetermined interval of time, for providing in response to said first output signal a rate limited signal indicative of said given physical parameter limited as to the rate of change thereof with respect to time, for comparing said rate limited signal with said first output signal, and for providing a signal indicative of excess rate fault in the event that said rate limited signal differs from said first output signal by more than a third one of said predetermined threshold signal magnitudes.

2. An activity-monitored sensor system according to claim 1 further characterized by said first sensor providing said first output signal in response to the magnitude of said given physical parameter and said second sensor providing said second output signal in response to the rate of change with time of the magnitude of said given physical parameter, said second physical parameter being the rate of change with respect to time of said given physical parameter.

* * * * *